United States Patent [19]

Zambrano

[11] Patent Number: 5,940,711
[45] Date of Patent: Aug. 17, 1999

[54] METHOD FOR MAKING HIGH-FREQUENCY BIPOLAR TRANSISTOR

[75] Inventor: Raffaele Zambrano, San Giovanni La Punta, Italy

[73] Assignee: STMicroelectronics, S.r.L., Agrate Brianza (MI), Italy

[21] Appl. No.: 08/901,709

[22] Filed: Jul. 25, 1997

Related U.S. Application Data

[62] Division of application No. 08/720,492, Sep. 30, 1996, abandoned.

[30] Foreign Application Priority Data

Sep. 29, 1995 [EP] European Pat. Off. .............. 95830404

[51] Int. Cl.$^6$ .................................................. H01L 21/331
[52] U.S. Cl. .......................... 438/366; 438/371; 438/378; 438/348; 438/350; 438/368
[58] Field of Search .................................. 438/309, 366, 438/371–378, 564, FOR 165, FOR 189, 348–350, 368; 148/DIG. 10, DIG. 11; 257/592

[56] References Cited

U.S. PATENT DOCUMENTS

| | | | |
|---|---|---|---|
| 4,839,305 | 6/1989 | Brighton | 437/41 |
| 5,254,485 | 10/1993 | Segawa et al. | 437/31 |
| 5,386,140 | 1/1995 | Matthews | 257/592 |
| 5,409,845 | 4/1995 | Robinson et al. | 437/31 |
| 5,480,816 | 1/1996 | Uga et al. | 437/31 |
| 5,698,459 | 12/1997 | Grubisich et al. | 437/31 |
| 5,719,082 | 2/1998 | Violette | 438/309 |
| 5,726,069 | 3/1998 | Chen et al. | 437/31 |

FOREIGN PATENT DOCUMENTS

| | | | |
|---|---|---|---|
| 42 40 205 | 8/1993 | Germany . | |
| 401082562 | 3/1989 | Japan | 438/FOR. 165 |
| 1196121 | 8/1989 | Japan . | |
| 404062849 | 2/1992 | Japan | 438/FOR. 165 |
| 4062849 | 2/1992 | Japan . | |
| 404260331 | 9/1992 | Japan | 438/FOR. 169 |
| 405041385 | 2/1993 | Japan | 438/FOR. 169 |
| 405041387 | 2/1993 | Japan | 438/FOR. 169 |
| 5041387 | 2/1993 | Japan . | |
| 405062986 | 3/1993 | Japan | 438/FOR. 169 |
| 405326536 | 12/1993 | Japan | 438/FOR. 165 |
| 93/08599 | 4/1993 | WIPO . | |

OTHER PUBLICATIONS

Warnock et al., "A Full E–Beam 0.25 μm Bipolar Technology with sub–25 ps ECL Gate Delay," *International Electron Devices Meeting*: 16.6–16.6.3, Dec. 8–11, 1991.

Gomi et al., "A Sub–30psec Si Bipolar LSI Technology," *International Electron Devices Meeting*: 744–747, Dec. 11–14, 1988.

Isaac, et al., "Method for Fabricating A Self–Aligned Vertical PNP Transistor," *IBM Technical Disclosure Bulletin*, vol. 22 (8A), Jan. 1980.

*Primary Examiner*—Peter Toby Brown
*Assistant Examiner*—Long Pham
*Attorney, Agent, or Firm*—David V. Carson; Seed and Berry LLP

[57] ABSTRACT

A process for forming a structure of a high-frequency bipolar transistor on a layer of a semiconductor material with conductivity of a first type. The process includes forming a first shallow base region by implantation along a selected direction of implantation and using a dopant with a second type of conductivity. The region extends from a first surface of the semiconductor material layer and encloses, toward said first surface, an emitter region with conductivity of the first type. In accordance with the invention, the implantation step includes at least one process phase at which the direction of implantation is maintained at a predetermined angle significantly greatly than zero degrees from the direction of a normal line to said first surface. Preferably, the implantation angle is of about 45 degrees.

23 Claims, 6 Drawing Sheets

Fig. 4

METHOD FOR MAKING HIGH-FREQUENCY BIPOLAR TRANSISTOR

CROSS-REFERENCE TO RELATED APPLICATION

This application is a division of U.S. patent application No. 08/720,492, filed Sep. 30, 1996 now abandoned.

FIELD OF THE INVENTION

This invention relates to a process for forming a structure, in particular monolithically integrated, of a high-frequency bipolar transistor.

The process provides for forming, onto a layer of a semiconductor material with conductivity of a first type, a first shallow base region by implantation along a selected direction of implantation and using a dopant with conductivity of a second type, which region extends from a first surface of the semiconductor material layer and includes, toward the first surface, an emitter region with conductivity of the first type.

BACKGROUND ART

As is well known, sophisticated techniques are currently employed in the formation of bipolar transistors, especially of those intended for applications which involve high switching frequencies. These techniques provide, for instance, for the isolation of adjacent components, using either a dielectric material or so-called trenches; the use of multiple polysilicon layers; self-alignment using dielectric material spacers which consist of a single layer of $SiO_2$ or of composite materials; and high-speed thermal treatments called RTPs (Rapid Thermal Processes), to be applied at various stages of the fabrication process.

Reference will be made herein, by way of example, to the forming process for a transistor formed with DPSSAT (Double Polysilicon Spacer Self-Aligned Transistor) technology, wherein a double layer of polysilicon is used, with self-alignment being ensured by spacers.

The structure and performance of a bipolar transistor for high frequencies, of this kind, are described, for example, in an article "Bipolar Device Design for High-density High-performance Applications" by P. C. Hunt, Proceedings of IEDM, 1989, pages 791–794.

Figure 1:
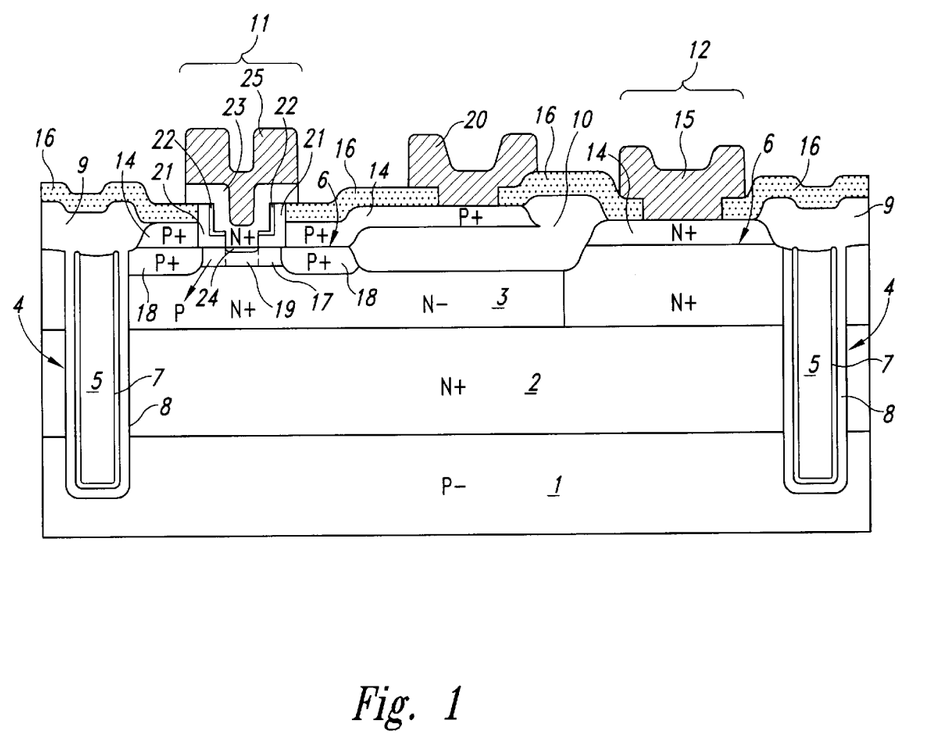
FIG. 1 shows schematically a cross-sectional view of a conventional structure of a high-frequency bipolar transistor, which can be fabricated by the fabrication process of the present invention.

An example of a conventional structure of a high-frequency bipolar transistor, such as that described in the above article, is illustrated by FIG. 1. A single component has been shown therein, which by way of example only is a transistor of NPN type, i.e. of the type more frequently used in integrated circuits.

FIG. 1 shows a cross-section drawn, not to scale, through a chip of a semiconductor material which includes a substrate, denoted by 1, of the P-type, a buried layer 2 of the N+ type, and an epitaxial layer 3 of the N-type. The transistor is isolated laterally from adjacent components or structures, not shown in the Figure, by so-called isolation trenches, denoted by 4, which define peripherally the region wherein the transistor is formed. The trenches 4 consist of a dielectric multilayer. In particular, they include a central region 5 of polysilicon which extends vertically down to the substrate 1 from the surface 6 of the chip, a layer 7 of silicon nitride which surrounds the region 5 completely but for its portion facing the surface 6, and an outermost layer of thermal silicon oxide 8 to complete the construction of the trenches 4.

Field oxide regions 9 and 10, define the active area zones—i.e. zones where the epitaxial layer 3 is not covered by the field oxide—and extend through the surface 6. In particular a first of these regions 9 is formed over the trenches 4, the second region 10 is located in an intermediate zone and defines two separate active area zones 11 and 12 wherein the contacts are formed, respectively on the left and right sides, as viewed in FIG. 1, of the field oxide 10. Included in the epitaxial layer 3 beneath zone 12 is a so-called sinker region 13 of the N+ type which is extended to the buried layer 2.

A first polysilicon layer 14, doped N+ in zone 12, contacts the monocrystalline silicon, specifically in the sinker region 13. A metal layer 15, forming the collector contact, is in electric contact with the first polysilicon layer 14 through an opening in an overlying oxide layer 16.

Formed in the active area zone 11 is a first shallow base region 17 doped P. A second base region 18, called an extrinsic base region, is shown by the two P+ regions 18 in cross-sectional view of FIG. 1. The second base region 18 surrounds the first base region 17. The first polysilicon layer 14, doped P+, is also formed over the base regions 18, in contact therewith, and one end of the layer is extended partly over the field oxide region 10 to contact a base metallization 20.

An emitter opening or window is defined through the layers 16 and 14, above the first base region 17. The lateral corner edges of this opening are covered with two symmetrical L-shaped portions of an insulating material, called the side spacers. Both spacers comprise, of preference, a layer 21 of silicon oxide and a layer 22 of silicon nitride. A second polysilicon layer 23, doped for conductivity of the N+ type, contacts the surface 6 of the chip at the exposed portions of the emitter window.

As shown in FIG. 1, a surface region 24 formed by diffusion from the polysilicon layer 23, represents the emitter active region. The region 24 is fully included within the first base region 17. Thus, a base region in the proper sense of the word, or so-called intrinsic base region 19, can be defined inside the first base region 17, underneath the emitter region 24.

The second polysilicon layer 23, being U-shaped, covers the spacers 21 and 22, and extends partly over the silicon oxide layer 16. Next, the second polysilicon layer 23 is overlaid by an emitter metallic contact 25.

The above technology yields transistors which have excellent dynamic performance, with cutoff frequencies in excess of 20 GHz, propagation times on the order of 40 ps, and power-by-speed products of about 40 fJ.

But applications of more recent acquisition demand still better performance, especially higher cutoff frequencies, and need shorter propagation times. To this aim, it is necessary that the distributed base resistance $r_{bb}$, which accounts for several resistive contributions between the intrinsic base active region 19 and the base contact 23, be first reduced. In this way, the charging and discharging times of the capacitances of the base-emitter junction can be shortened.

To further improve dynamic performance, the thickness of the intrinsic base must be reduced; propagation time, which is tied to this quantity by quadratic law, can thus be reduced considerably.

To reduce the intrinsic base thickness 19, and hence the junction depth, the dopant depth of penetration must be reduced. Specifically in a standard process, the depth of the intrinsic base region 19 at the end of the process is attained in consecutive steps. The process provides for the implanting of dopant ions, such as boron B+ in the instance of an NPN transistor, followed by thermal treatments in the oven and/or RTP processing.

A first attempt at reducing the dopant penetration included suppressing, or at least reducing the temperatures and durations of the after-implantation thermal treatments. In this way, a dopant concentration profile is obtained which differs only slightly from the earlier mentioned implanted profile of FIG. 1.

In order to reduce the dopant penetration during the implanting step, the most up-to-date processes adopt low-energy implantation methods. However, account must be taken of the channeling phenomenon, which restricts the applicability of this approach.

To compensate or attenuate this phenomenon, several solutions have been adopted such as the introduction of pre-amorphizing techniques and/or the use of heavier, less-penetrating molecules; e.g., molecules of $BF_2$ have been used for NPN transistors. Nevertheless, serious limitations still militate against attaining shallower intrinsic base regions.

SUMMARY OF THE INVENTION

According to principles of the invention an intrinsic base region is formed by implanting the dopant along a substantially different direction from the normal to the surface to be implanted.

A process for forming a structure of a high-frequency bipolar transistor, according to the invention, provides for forming, on a layer of a semiconductor material with conductivity of a first type, a first shallow base region having a second type of conductivity. This region extends from a first surface of the semiconductor material layer and encloses, toward said surface, an emitter region with conductivity of the first type. The step of forming the intrinsic base region includes, in accordance with a conventional technique, an implantation operation of a dopant having said second type of conductivity, along a selected direction of implantation.

In accordance with the invention, the implantation operation includes at least one step where the direction of implantation is maintained at a predetermined angle which is significantly greater than zero degrees, to the direction described by a normal line to the first surface. In particular, this angle is between 8° and 80°, preferably of about 45°.

In certain applications, the process of this invention further comprises a subsequent phase where the direction of implantation is symmetrical of the corresponding direction maintained during the previous step, with respect to that normal.

In preferred embodiments, the implantation can be incorporated to conventional processes.

This invention further concerns a high-frequency bipolar transistor of the type which includes, in a layer of semiconductor material with conductivity of a first type, a first base region having a second type of conductivity, extending from a first surface of the semiconductor material layer. An emitter region with conductivity of the first type is also formed toward the first surface of the semiconductor material. The first base region is formed by implantation to a thickness of less than 0.5 micrometers.

More particularly, in a preferred embodiment of the transistor according to the invention, the first base region includes an intrinsic base region located centrally beneath the emitter region, and an extrinsic base portion located peripherally in contact with the first surface. According to the invention, the extrinsic base portion included in the first base region is doped to a lower level than the intrinsic base region. Preferably, the ratio of these dopings lies between 0.5 and 0.75.

The transistor may equally be of the NPN or the PNP type. In the former case, the first and second types of conductivity are P and N types, respectively, and the intrinsic base region is preferably doped with boron ions or ionized molecules of $BF_2$. In the latter case, the first and second types of conductivity would be N and P types, respectively, and the intrinsic base region preferably doped with arsenic ions.

A particular advantage of this invention is providing a process for forming a structure of a high-frequency bipolar transistor, whereby the depth of the intrinsic base region can be reduced even further. Concurrently therewith, the depth of penetration afforded by the process of this invention is predictable and repeatable.

A further advantage is providing a process which is specially simple and involves no added steps, while being compatible with currently known processing techniques.

BRIEF DESCRIPTION OF THE DRAWINGS

The features and advantages of the bipolar transistor forming, process of this invention are provided in the following detailed description of embodiments thereof, given by way of non-limitative example with reference to the accompanying drawings.

DETAILED DESCRIPTION

Structures of bipolar transistors for high-frequency applications specifically include, in accordance with this invention, a first shallow base region which includes an intrinsic base region and is formed in a layer of semiconductor material facing a first surface thereof The semiconductor material usually is monocrystalline silicon and has conductivity of a first type. The first base region has a second type of conductivity and is formed, as explained in detail earlier herein, by implanting a dopant with the second type of conductivity along a selected direction of implantation. The base region includes an emitter surface region, usually formed by dopant diffusion from an overlying polysilicon layer with conductivity of the first type. A second base region—called the extrinsic base region and being heavily doped and forned preferably by diffusing dopants from another layer of polysilicon—surrounds the first base region.

The process of this invention is preferably applied to the formation of a monolithically integrated bipolar transistor of this type. The invention covers bipolar transistors of both the NPN and PNP types.

According to the invention, the dopant required to make the first base region, specifically the intrinsic base, is introduced using the angular implantation technique, whereby the implantation operation will not be carried out along a substantially orthogonal direction to the surface. Another implantation comprises at least one step during which the direction of implantation is maintained at a predetermined angle which is significantly greater than 0°, being illustratively greater than 10°, to a normal direction to the silicon surface.

As explained hereinafter in connection with an embodiment of this process, further implants are sometimes effected preferably along directions which form the same angle to the normal but are symmetrical of the corresponding direction maintained during the previous phase, with respect to the normal. More particularly, four implants are made along directions which lie in two planes rotated at 90° from each other. This may be necessary to ensure that the first base region has no portions which are totally free of dopant at so-called blank zones where the implant is screened off by the presence of layers formed over the silicon and bordering with the intrinsic base region.

Particularly in a preferred embodiment, the angle formed by the implant directions with the normal to the surface is between 8° and 80°, preferably of about 45°.

In general, for an implantation carried out at a predetermined angle x, the dopant penetration is reduced, by a factor equal to the cosine of the angle x, from that of a conventional implantation performed at a zero-degree angle. Specifically, were the angle of 45°, this would mean a reduction factor of 0.707, that is approximately 70% less depth. Where an implantation can be performed at a greater angle than 60°, the result is even better, giving a smaller factor than 0.5.

Specifically to form a bipolar transistor of the NPN type, i.e. a transistor wherein the first and second types of conductivity are of the N and the P type, respectively, the implant may comprise boron ions B+, or more advantageously, ionized molecules of boron fluoride $BF_2+$ which would penetrate the silicon even less deeply on account of their greater mass. With PNP bipolar transistors, wherein the polarities would be reversed from the former, a stream of arsenic ions As+ may be used for the implant.

Figure 2:
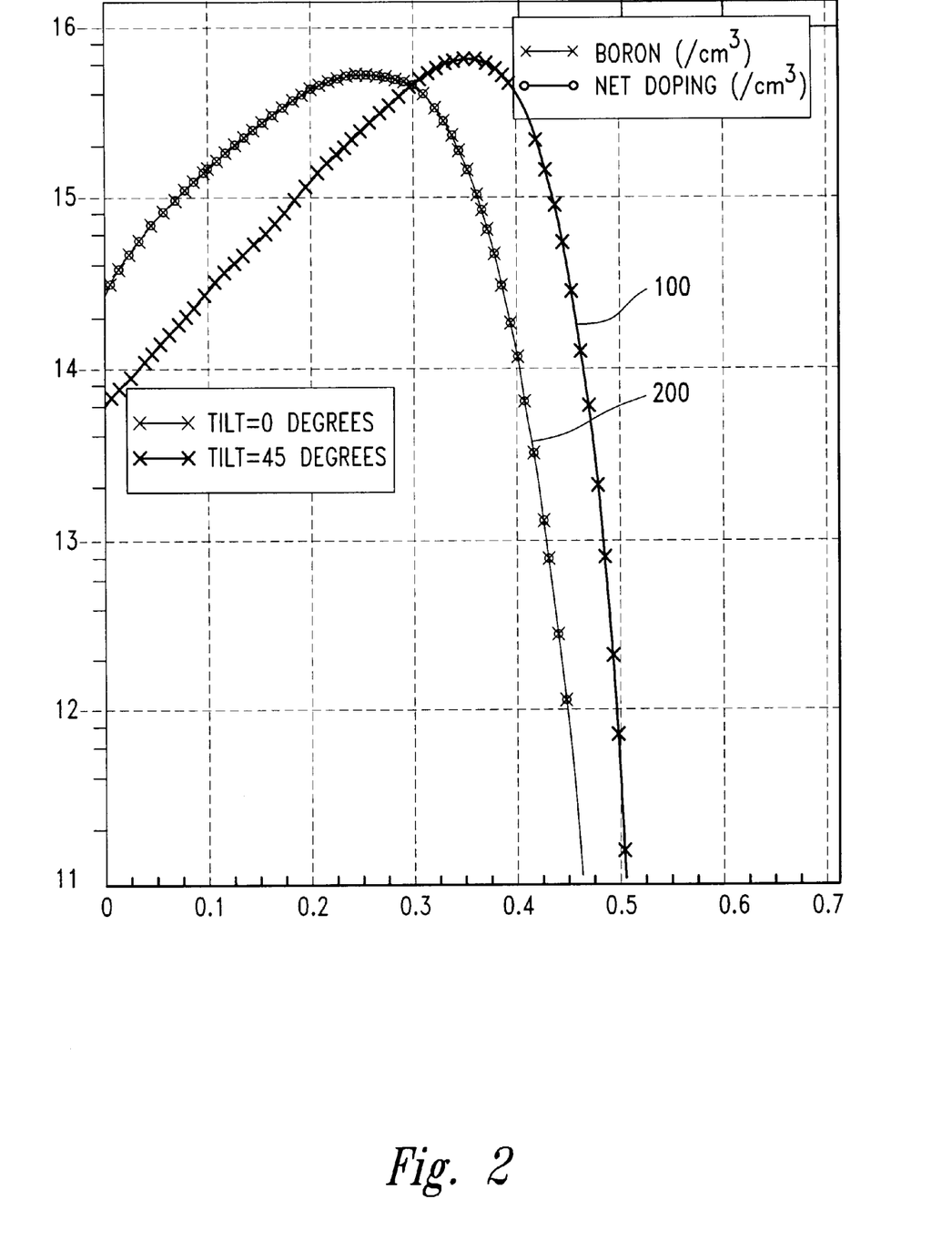
FIG. 2 is a simulation of the resultant doping profile in the inventive process compared to that of a conventional process.

Plotted in FIG. 2 is a simulation which shows two doping implantation profiles 100 and 200 which have been carried out at 0° and 45° from the normal to the surface. The profiles 100 and 200 use a conventional technique and the process of this invention, respectively. For the simulation, implants of boron ions at a dosage of $1E11/cm^2$ and energy of 100 keV have been considered. The X-axis linearly shows the depth of the implant region under the surface, whereas the Y-axis shows the dopant ion concentration, on a logarithmic scale, for the implanted region, at the respective depth. The curves are presented as distributions of the dopant ion concentrations and may be approximated to functions of the Gaussian type.

It is apparent from FIG. 2 that, with a process according to the invention, the boron penetration depth is smaller then in a conventional process. In particular, the value of the so-called "projected range" Rp, i.e. the mean penetration value, as expressed by the peak values of the curves 100 and 200, has been reduced by a factor of about 0.7 on the curve 200.

The parameter DRp, which represents the standard Gaussian deviation, is virtually unaltered on both curves, as clearly shown in the FIG. 2.

Thus, with this process, specially thin intrinsic base regions can advantageously be obtained having a thickness of 0.5 micrometers or even less. In a realistic instance of the implantation energies being of 30 to 40 keV, a thickness of less than 0.15 micrometers can be obtained.

The description of a process for forming a high-frequency bipolar transistor according to the invention will be given with specific reference, for clarity, using the preferred embodiments. To form a structure of a bipolar transistor according to the invention, the DPSSAT process is preferably used. Specific reference to a process of this kind will be made in the examples described herein below.

Significant steps of a first preferred embodiment of the inventive process for forming a bipolar transistor, in particular of the inside spacer type as described earlier and illustrated by FIG. 1, are illustrated by FIGS. 3 to 7. These Figures show vertical cross-section views, not drawn to scale, of a single transistor whose emitter and base regions are visible in detail therein. For convenience of illustration, similar regions carry the same reference numerals as in FIG. 1. Only those steps of the process have been shown in detail more significant, for the purpose of this invention, on the formation of the intrinsic base region of the bipolar transistor.

Figure 3:
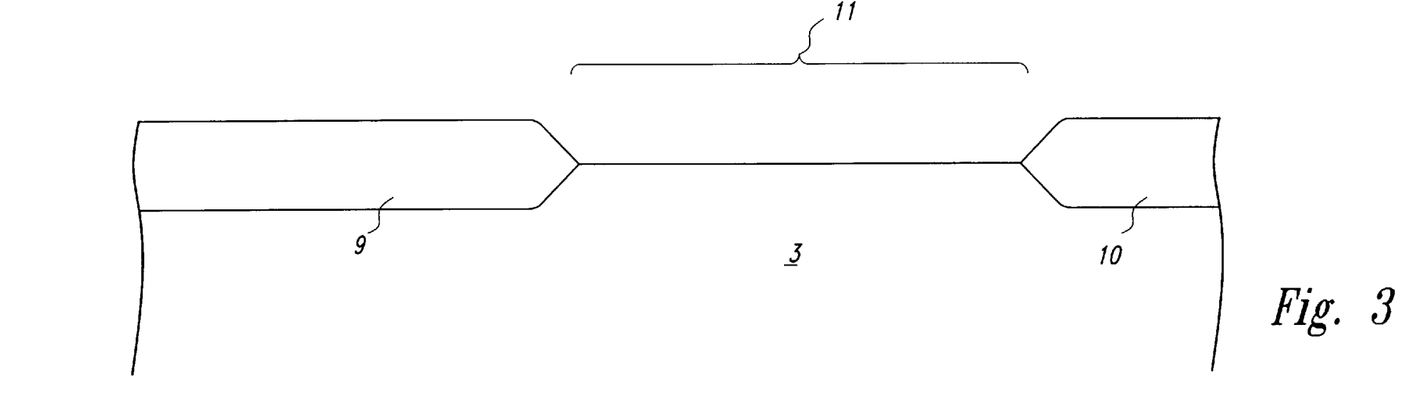
FIGS. 3–7 are sectional views schematically illustrating successive initial steps of a first embodiment of the inventive process for making a transistor of the type shown in FIG. 1.

The process starts with conventional steps, not shown in the Figures, that define active area zones. Specifically, layers of silicon nitride $Si_3N_4$ and a "pad" oxide layer are formed on an epitaxial layer of monocrystalline silicon having a first conductivity type. The layers are patterned and field oxide regions are grown selectively. Referring to FIG. 3, the epitaxial layer is denoted by 3, and two regions 9 and 10 of field oxide are shown. The silicon nitride and pad oxide layers are then removed from outside the field oxide regions 9 and 10 to define the active area region 11 of the transistor. Detailed in FIG. 3 is the active area portion 11 bounded by the regions 9 and 10 where the emitter and base contacts are to be formed.

Figure 4:
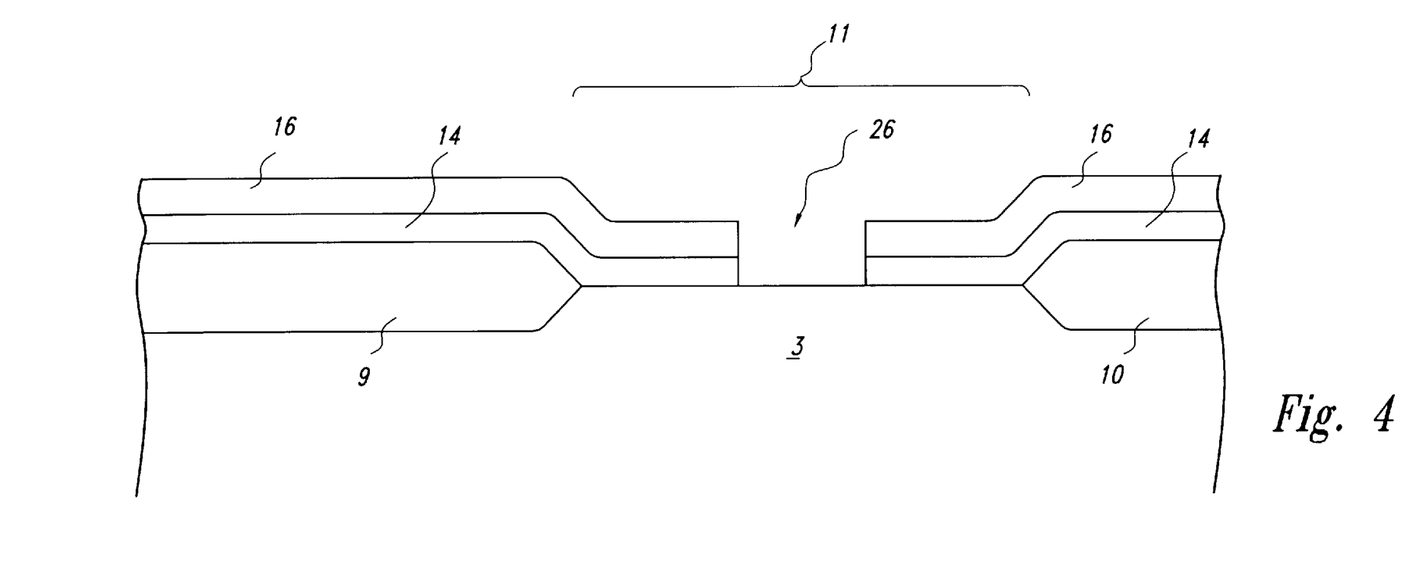

Thereafter, as illustrated in FIG. 4, a first polysilicon layer 14 is deposited over the entire surface. This layer is then doped by implanting a dopant with a second type of conductivity, specifically of the P type for an NPN transistor. In this case, a preferred dopant is boron. Over the polysilicon layer 14 as well as the whole structure, a silicon oxide layer 16 is formed, e.g. by deposition using a CVD (Chemical Vapor Deposition) technique. Next, an emitter window 26 is selectively etched through the oxide layer 16 and the first layer 14 of polysilicon. This window is located at a portion which will include the emitter active region which is formed later in the process.

Figure 5:
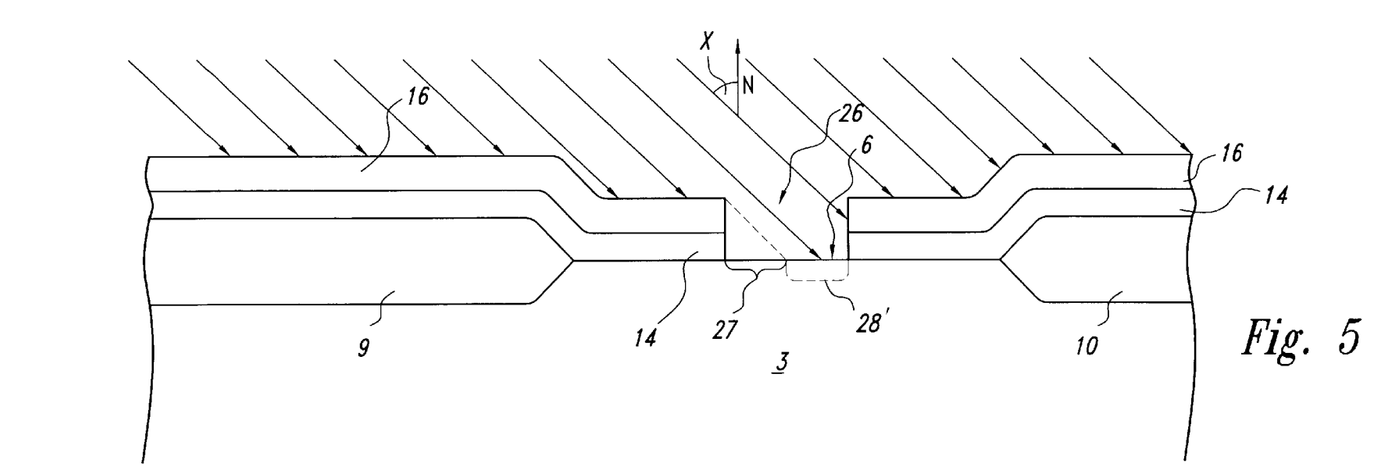

At this stage of the process, a first shallow base region is formed which includes a centrally located active region of intrinsic base and a peripheral extrinsic base portion. In accordance with the invention, and as shown in FIG. 5, the dopant ions for the formation of that base region are angularly implanted. The ion beam, indicated in FIG. 5 by parallel arrows defining the direction of implantation, forms an angle x which is significantly greater than 0° with the normal direction to the silicon surface 6. The normal direction is also indicated by an arrow N, for clarity of illustration. In the preferred embodiment, the direction of implantation forms an angle x of about 45°.

In the specific instance of an NPN transistor, boron ions B+ are preferred for the implant, as mentioned earlier.

Due consideration should be given to the presence, in zones adjacent to the emitter window 26, of a multilayer resulting from the superimposition of the oxide layer 16 and the first polysilicon layer 14 on top of the silicon 3. This multilayer acts to screen off the penetration of the dopant ions. As can be seen in FIG. 5, a portion 27 of the window 26 represents a blank zone, i.e. a zone wherefrom the implant is substantially absent due to screening from adjacent layers. The width of the blank zone will obviously depend on the direction of implantation, i.e. on the angle x, and on the height of the side layers which act as masks. For clarity, FIG. 5 shows a dash line 28' which indicates the limit of the implanted zone at the end of this implantation step.

Figure 6:
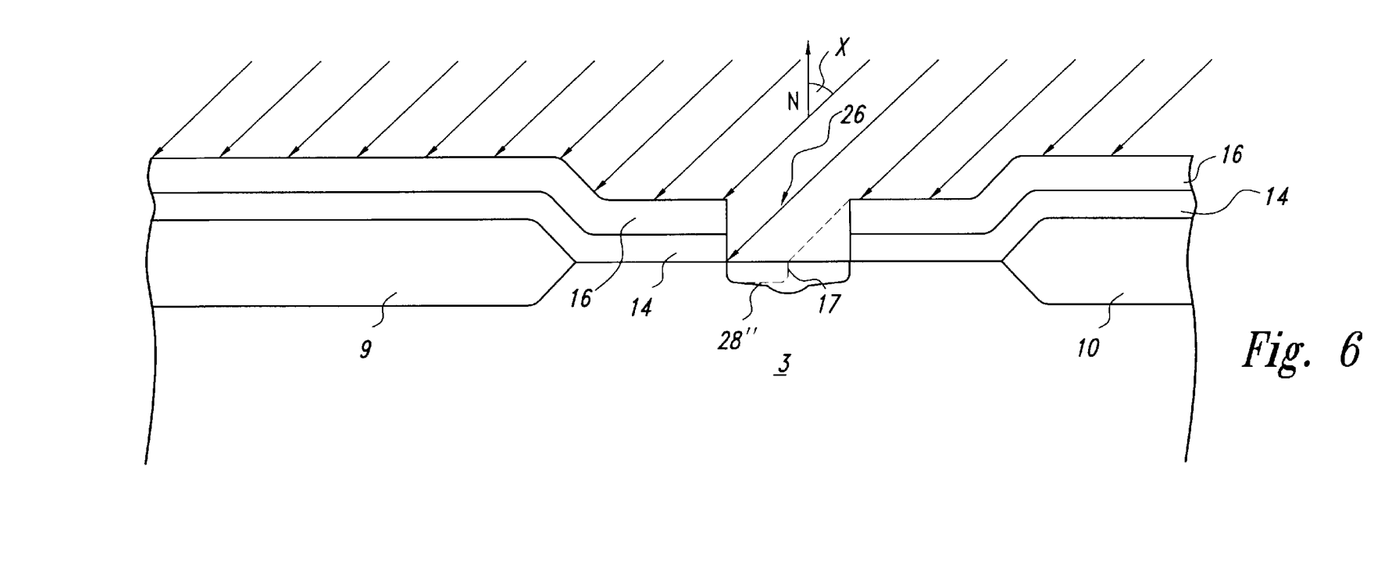

This explains why a second implantation step is to be carried out as shown in FIG. 6. This second implantation is preformed along an implant direction which also forms an angle x, equal to that in FIG. 5, to the normal N to the surface 6. However, this new direction of implantation is symmetrical of the corresponding direction maintained during the previous step, with respect to the normal N. The implant, such as it would be obtained by this second step alone, is indicated by another dash line 28". It can be seen that the blank zone portion 27 of FIG. 5 presently receives dopant ions, and that a blank zone now appears in the portion farther to the right of the emitter window 26.

Also shown, bounded by a solid line in FIG. 6, is the first base region 17. This region results from the double implantation: the punctual sum of the two curves 28' and 28" sets the actual depth of the base implant. For clarity, in the two previous Figures, the base region and the differences between the blank zones and the implanted zones have been exaggerated. As can be seen in the Figure, the base region 17 comprises a central region which is more heavily doped and is to provide a region of intrinsic base, and a peripheral region which is less heavily doped, provides the extrinsic base portion of the region, and corresponds to the blank zones of the implants.

FIGS. 5 and 6 show cross-sectional views taken through the silicon chip along a direction which contains the emitter, base, and collector contacts of the transistor. The two previous implantations have been implicitly assumed to have been performed along a direction lying in that plane. In order to take account of the third direction, perpendicular to the plane of the drawing sheet, in a preferred embodiment of the process of this invention, two further implants, similar to those just described, are provided in the orthogonal plane, not shown in the drawings. In this case, each blank zone will receive 75% of the total implant dosage. As explained hereinafter, this circumstance is not one apt to create problems, and may rather bring about certain advantages.

Figure 7:
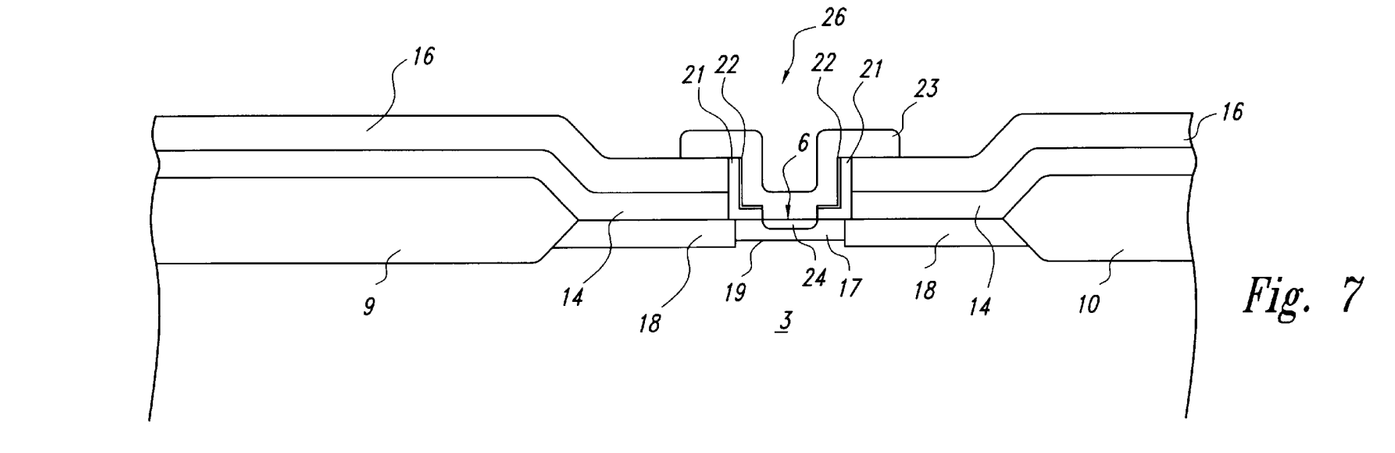

From now onwards, the process for forming the transistor is carried out through standard steps. Laterally within the emitter window 26, spacers, i.e. portions of spacing dielectric material, are first formed. These are preferably formed by the following successive steps: oxidizing the side surfaces of the window 26 and the substrate surface to form a fairly thin, compared to the other layers, silicon oxide layer 21; depositing an equally thin silicon nitride layer 22 over the entire surface; forming an overlying sacrificial layer, preferably of polysilicon; anisotropically etching away the sacrificial layer throughout but for the zones along the bottom of the opening step; thoroughly removing the silicon nitride layer 22 and the oxide layer 21 from the unscreened regions of the remainder of the sacrificial layer; and removing the sacrificial layer. In this way, the spacers are given a typical L-shape, as shown in FIG. 7. Accordingly, the silicon surface 6 will be exposed in the central region, at the window 26 bottom.

Thereafter, a second polysilicon layer 2' for the emitter is deposited over the whole surface. In the regions inside the emitter window 26 not covered by the spacers, the second polysilicon layer 23 will be in contact with the silicon surface 6, specifically with the first base region 17. The second polysilicon layer 23 is then doped with a dopant having the first type of conductivity. In this example, the second polysilicon layer 23 is doped by a heavy-dosage implantation of arsenic As+.

The remaining active regions of the transistor, specifically the emitter region 24 and a second extrinsic base region of which two portions 18 are shown in FIG. 7, are then formed by thermal treatment. These regions are obtained by dopant diffusion from the second and first polysilicon layers 23 and 14, respectively. In addition, the second polysilicon layer 23 is patterned over the oxide layer 16 into the configuration shown in FIG. 7.

The final steps of the transistor formation have been omitted from the drawings and include the definition of the base and collector contact areas, and the metallization processes. The resultant transistor structure connections are similar to that is as shown in FIG. 1.

As can be seen in FIG. 7, the region 17, depicted uniform for simplicity, includes an intrinsic base region 19 in the proper use of the word, beneath the emitter region 24. The region 19 corresponds substantially to the central portion of the region 17 which has been shown in the preceding Figure and is more heavily doped. On the other hand the remaining zones toward the periphery of the base region 17, which correspond substantially to the more lightly doped blank implant zones, represent extrinsic base portions.

Advantageously, as shown in FIG. 7, those portions of the base region 17 which are covered by the spacers approximately correspond to the blank implant zones shown in FIGS. 5 and 6. Thus, there can be no areas of the base region 17 which will be more lightly doped than the blank zones, namely than the peripheral extrinsic base portions.

Furthermore, the blank zone doping is enhanced by lateral diffusion of the dopant molecules contained in the first polysilicon layer 14 during the formation of the extrinsic base regions 18. As shown, the regions 18 are extended partly under the spacers, into the emitter window 26.

A further consequent advantage of the inventive process just described is that the extrinsic base portions contained within the region 17 close to the emitter region 24 are somewhat less doped than with the conventional process. As a result, the emitter-to-base breakdown voltage of the transistor is set higher. It should not be overlooked that a low value of this parameter is a major problem with late generation devices.

Figure 8:
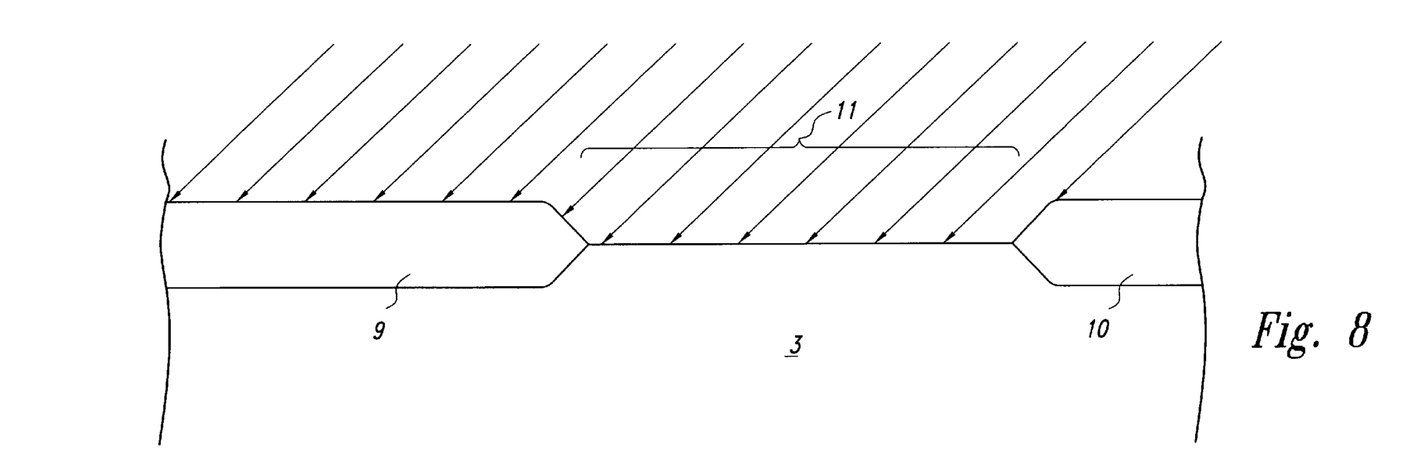
FIGS. 8, 9 and 10 are sectional views illustrating certain steps of a second embodiment of the process according to the invention.
Figure 9:
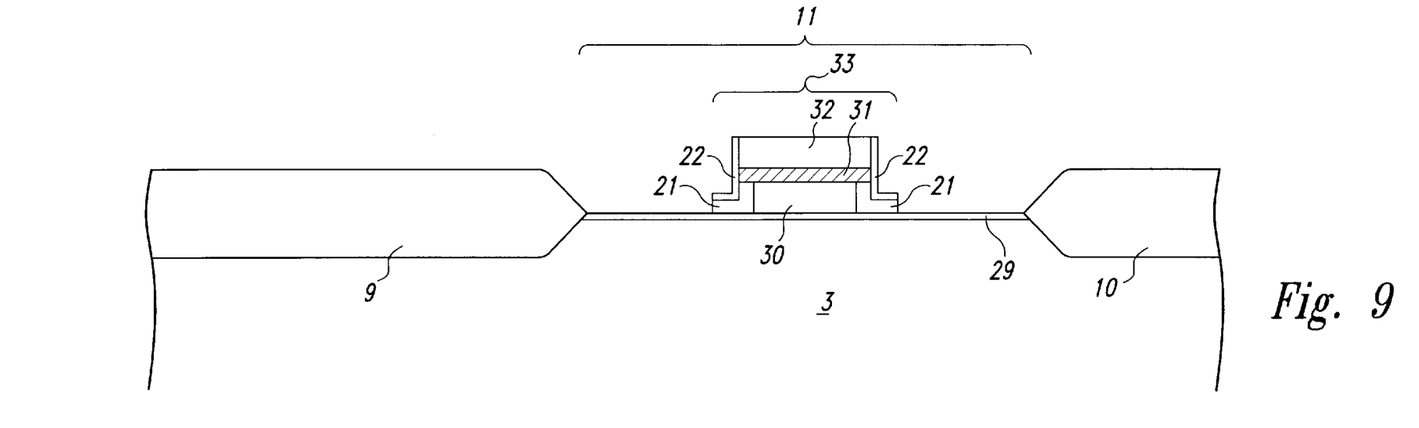
Figure 10:
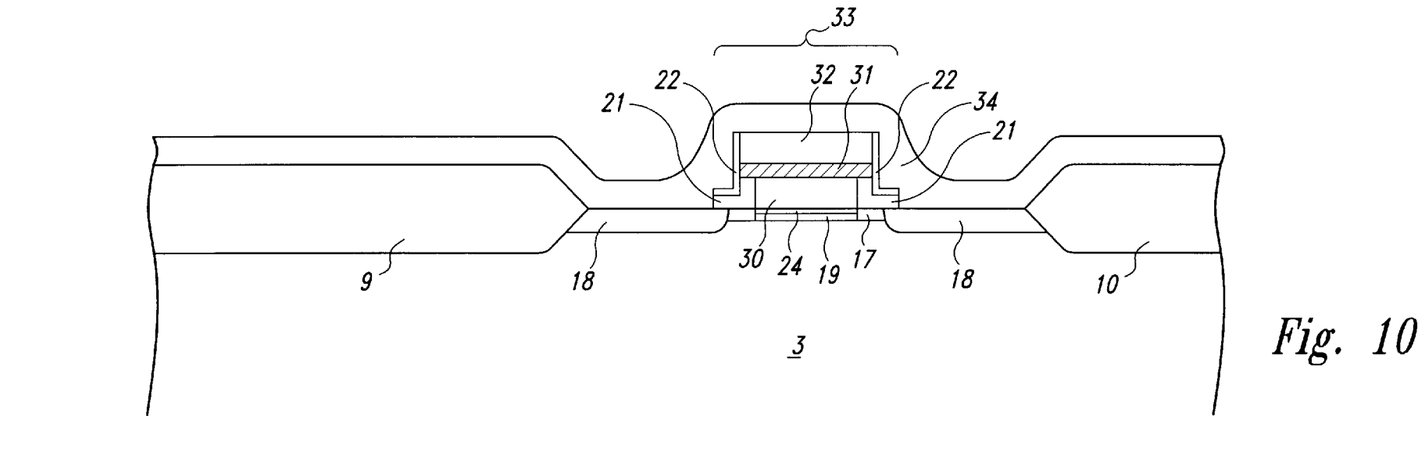

A second embodiment of the process according to the invention for forming a high-frequency bipolar transistor of the outside spacer type will be described next. A sequence of process steps are shown in FIGS. 8, 9 and 10 for this embodiment. In these Figures, the same reference numerals as in the previous Figures are used to denote corresponding regions.

During the initial process steps, field oxide regions 9 and 10 are formed into the epitaxial silicon layer 3 and define active area zones of which a portion 11 is shown in FIG. 8, similar to what has been described in relation to FIG. 3.

As shown in FIG. 8, in this second embodiment, the first base region, in particular the intrinsic base region, is implanted at this stage. Angular implantation is used for the purpose, in the same manner as described with reference to FIG. 5.

The implanted zone 29 spans here the whole active area portion 11 which is to include the emitter and base regions, as shown in FIG. 9. It can be seen therein that the blank zones locate at the extremities of that region, that is, away from the emitter and base active regions to be defined, at a later stage, in the epitaxial layer 3. This affords certain advantages to be described.

The base implant is followed by the deposition of a first polysilicon emitter layer 30 over the entire structure. This polysilicon layer 30 is doped with a dopant having the first type of conductivity, specifically with As+ ion is at a high dosage. In accordance with a known technique, moreover, a layer 31 of titanium silicide $TiSi_2$ is formed over the first polysilicon layer 30 to lower its resistivity. A silicon oxide layer 32 is formed on top of the first polysilicon layer 30, preferably by a CVD technique.

The three layers of silicon oxide 32, silicide 31 and polysilicon 30 are then removed from regions outside an emitter stack consisting of the previous layers as left over in a zone 33. Side spacers or portions of spacing, dielectric material are then formed laterally of the emitter region 33. These include, as shown in FIG. 9, a layer 21 of silicon oxide and an overlying layer 22 of silicon nitride. The spacers have the same shape and composition as those described earlier and illustrated by FIG. 7 in connection with the first embodiment. In this second example, however, they locate outside the emitter region, and it is on this account that they are known as outside spacers. The process steps for their formation have been described earlier herein.

With reference to FIG. 10, a second polysilicon layer 34 for the base of the transistor is deposited next. This layer will contact the epitaxial layer 3 in regions laterally spaced from the emitter region 33. The layer 34 is doped with a dopant having the second type of conductivity using boron.

Thereafter, the dopants are diffused from the first and second polysilicon layers 30 and 34 into the epitaxial layer 3 to respectively form the emitter region 24, fully enclosed within the emitter zone 33, and a second region of extrinsic base of which cross-sections 18 are shown. These set the side limits of the first base region 17, thereby defining it as illustrated. The base region 17 comprises, once again, a central intrinsic base region 19 underlying the emitter region 24, and a peripheral extrinsic base portion beneath the spacers. In this second embodiment, however, the first base region 17 is uniformly doped, in that no blank implant zones exist inside this region.

The subsequent steps of forming, the contacts and metallizations will not be described because these steps are conventional and outside the scope of this invention.

Notice that the second embodiment just described is a specially advantageous one in the respect of the number of process steps involved, because the formation of the intrinsic base region requires no additional implanting operation(s) in directions other than that shown in FIG. 8. The blank zones, as already mentioned above, are far here from the intrinsic base region, and are electrically inactive. Anyway, the blank zones are doped by diffusion of the dopant from the second layer of polysilicon during the forming step for the extrinsic base regions. It therefore becomes possible to perform the implantation along a direction at an even greater angle than 60°, thereby affording a significant advantage in terms of junction depth which, as will be recalled, is dependent on the cosine of the angle.

Notice, moreover, that while reference has been made in the foregoing to the instance of the transistor being an NPN type, a similar process can be applied to yield a similar structure in the instance of a PNP transistor, by simply reversing the conduction signs throughout.

In both of the preferred embodiments described, the implanting operation for forming the intrinsic base region is, therefore, compatible with standard processes.

Additionally, the process of this invention is very simple. The forming step for the base region does not represent an added step into the process, with respect to conventional processes, and can be incorporated to standard technologies.

It should be noted that the intrinsic base forming process is repeatable. The intrinsic base depth is predictable from the process parameters because it depends on the angle selected for the direction of implantation. In addition, specifically in the two embodiments described, the base region during the steps following its formation is only subjected to thermal treatments of the type which will not increase its depth to any significant extent.

It will be appreciated that the embodiments described may be modified to some extent by a skilled person in the art. For example, the implanting operation may be preceded by a pre-implant oxidation, i.e. the formation of a thin layer of silicon oxide in at least a portion of the silicon surface where the implantation is to be performed, in direct contact with the layer of semiconductor material. Of course, this additional oxide layer should be thin enough to be transparent to the implant, i.e. enough to allow the ions to be implanted through it.

Also, in order to further reduce the implant depth, the use of heavier molecules for the doping is to be preferred whenever possible.

The process according to this invention can also be applied to discrete devices, in which case the substrate would have the same conductivity as the epitaxial layer wherein the base region is formed.

It should be understood that chances and modifications may be made in the process for forming a high-frequency bipolar transistor described hereinabove and illustrated by the accompanying drawings, within the scope of the invention as defined in the following claims.

I claim:

1. A process for forming a structure of a high-frequency bipolar transistor comprising the steps of:

providing a layer of a semiconductor material with conductivity of a first type; and forming a first shallow base region by a first implantation along a first direction of implantation and using a dopant with a second type of conductivity, the first shallow base region extending from a first surface of the semiconductor material layer and encloses, toward said first surface, an emitter region formed at the first surface of the semiconductor material with conductivity of the first type;

wherein said first implantation includes at least one step in which the first direction of implantation is maintained at an angle which is greater than zero degrees to the direction of a line normal to said first surface; and wherein the step of forming the first shallow base region includes employing a second implantation at a second direction of implantation that is symmetrical to the first direction of implantation with respect to said line normal to said first surface.

2. The process according to claim 1 wherein said angle ranges from 8 to 80 degrees.

3. The process according to claim 2 wherein said angle is approximately 45 degrees.

4. The process according to claim 1 wherein said first and second types of conductivity are of the N type and P type, respectively, and wherein said implantation is performed using boron ions.

5. The process according to claim 1 wherein said first and second types of conductivity are of the N type and P type, respectively, and wherein said implantation is performed using ionized molecules of $BF_2$.

6. The process according to claim 1 wherein said first and second types of conductivity are of the P type and N type, respectively, and wherein said implantation is performed using arsenic ions.

7. The process according to claim 1 wherein said implantation operation is preceded by the formation of a thin layer of silicon oxide, in at least one portion of said first surface where the implantation is performed, in direct contact with the layer of semiconductor material.

8. The process according to claim 1 wherein the thickness of said first base region is less than 0.5 micrometers.

9. The process according to claim 1 wherein said first implantation is performed in at least one active area zone which also includes a second base region of the transistor surrounding said first base region.

10. A process for forming a structure of a high-frequency bipolar transistor comprising the steps of:

providing a semiconductor material layer having a first conductivity type;

depositing a first polysilicon layer over an entire surface of the semiconductor material layer whereon active zones are bounded by field oxide regions;

doping said first polysilicon layer by implantation of a dopant having a second conductivity type;

forming a silicon oxide layer over said first polysilicon layer;

defining an emitter window by making an opening through said silicon oxide layer and said first polysilicon layer;

forming a first base region by implantation along a first direction of implantation and using a dopant having the second conductivity type, said first base region extending from said surface of the semiconductor material layer;

forming portions of a spacing dielectric material on side walls within the emitter window;

depositing a second polysilicon layer in contact with said semiconductor material layer in regions within said window not covered by said spacing dielectric material;

doping said second polysilicon layer by implantation of a second dopant having the first conductivity type; and diffusing by thermal treatment the respective dopants into the semiconductor material layer from said first and second polysilicon layers to respectively form a second base region and an emitter region, said second base region surrounds said first base region in said layer of semiconductor material, and said emitter region with conductivity of said first type is surrounded by said first base region;

wherein said implantation along the first direction includes at least one step whereat the first direction of implantation is maintained at an angle greater than zero degrees to the direction of a line normal to said surface of the semiconductor material layer.

11. The process according to claim 10 wherein the step of forming the first base region includes employing a second implantation at a second direction of implantation that is symmetrical to the first direction of implantation with respect to said normal.

12. The process according to claim 10 wherein said angle is about 45 degrees.

13. A process of manufacturing a high-frequency bipolar transistor comprising the steps of:

forming an epitaxial layer having a first conductivity type over a substrate;

forming field oxide regions to define active areas on said epitaxial layer;

depositing a first polysilicon layer having a second conductivity type over said substrate;

forming an oxide layer over said first polysilicon layer;

selectively etching said first polysilicon and oxide layer to expose central surface portions of said active areas;

obliquely implanting a second conductivity type dopant in said exposed active areas to form a first base region, said first base region having a predetermined depth from the surface of said epitaxial layer;

forming sidewall insulators on sidewalls of said selectively etched first polysilicon and oxide layers;

depositing a second polysilicon layer having said first conductivity type on said exposed surface portions of said first base region; and thermally diffusing the respective dopants into the epitaxial layer from said first and second polysilicon layers to respectively form a second base region and an emitter region, said second base region surrounds said first base region and said emitter region is contained within said first base region and laterally separated from said second base region.

14. The process of claim 13 wherein said step of forming sidewall insulators further includes the steps of sequentially forming an oxide layer and a nitride layer over the sidewalls of said etched polysilicon and oxide layers.

15. The process of claim 13 wherein said step of obliquely implanting further includes the step of performing a first oblique implantation at about 45 degrees relative to normal plain of said substrate and a complimentary second oblique implantation at about 135 degrees relative to the normal plain of said substrate.

16. The process of claim 15, further including the steps of providing a first and second implantation of said second conductivity type into said active areas and in a direction perpendicular to a surface of said substrate.

17. The process of claim 13 wherein said first base region depth is less than 0.5 mm.

18. The process of claim 13 wherein the first base region laterally separating said second base region and said emitter region has a lower dopant concentration than said second base region.

19. A process of manufacturing a high-frequency bipolar transistor comprising the steps of:

forming an epitaxial layer having a first conductivity type over a substrate;

forming field oxide regions to define active areas on said epitaxial layer;

obliquely implanting a second conductivity type dopant in said active areas to form a first base region, said first base region having a depth from the surface of said epitaxial layer;

depositing a first polysilicon layer having said first conductivity type over said substrate;

selectively etching said first polysilicon layer to expose surface portions of said active areas adjacent said field oxide regions;

forming sidewall insulators on the sidewalls of said selectively etched first polysilicon layer;

depositing a second polysilicon layer having said second conductivity type on said exposed surface portions of said active areas and over said first polysilicon layer; and thermally diffusing the respective dopants into the epitaxial layer from said first and second polysilicon layers to respectively form a second base region and an emitter region, said second base region surrounds a central portion of said first base region and said emitter region is contained within a central portion of said first base region and laterally separated from said second base region.

20. The process of claim 19 wherein said step of obliquely implanting further includes the step of performing a first oblique implantation at between 8 and 80 degrees relative to a normal plain of said substrate and a complimentary second oblique implantation at between 98 and 170 degrees relative to the normal plain of said substrate.

21. The process of claim 19 wherein said first base region depth is less than 0.5 mm.

22. The process of claim 19, further including the steps of depositing a silicide layer on said etched first polysilicon layer and forming an oxide layer on said silicide layer.

23. The process of claim 22 wherein said silicide layer is titanium silicide.

\* \* \* \* \*